United States Patent
Srinivasan et al.

(10) Patent No.: US 9,583,336 B1
(45) Date of Patent: Feb. 28, 2017

(54) PROCESS TO ENABLE FERROELECTRIC LAYERS ON LARGE AREA SUBSTRATES

(71) Applicant: Texas Instruments Incorporated, Dallas, TX (US)

(72) Inventors: Bhaskar Srinivasan, Plano, TX (US); Asad Mahmood Haider, Plano, TX (US); Brian E. Goodlin, Plano, TX (US); Haowen Bu, Plano, TX (US); Roger Charles McDermott, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/047,592

(22) Filed: Feb. 18, 2016

(51) Int. Cl.
H01L 35/34 (2006.01)
H01L 31/18 (2006.01)
H01L 21/02 (2006.01)
H01L 21/687 (2006.01)
H01L 21/67 (2006.01)

(52) U.S. Cl.
CPC .. H01L 21/02271 (2013.01); H01L 21/67103 (2013.01); H01L 21/68742 (2013.01)

(58) Field of Classification Search
CPC ................................. H01L 35/34; H01L 31/18
See application file for complete search history.

(56) References Cited

U.S. PATENT DOCUMENTS

| 6,316,797 B1 | 11/2001 | Van Buskirk et al. |
| 6,730,354 B2 | 5/2004 | Gilbert et al. |
| 6,984,417 B2 | 1/2006 | Van Buskirk et al. |
| 7,312,091 B2 | 12/2007 | Lee et al. |
| 7,862,857 B2 | 1/2011 | Van Buskirk et al. |
| 2002/0015855 A1* | 2/2002 | Sajoto .................. C23C 14/568 428/639 |

* cited by examiner

*Primary Examiner* — Mohammad Choudhry
(74) *Attorney, Agent, or Firm* — Jacqueline J. Garner; Frank D. Cimino (57) ABSTRACT

A microelectronic device with a ferroelectric layer is formed using an MOCVD tool. A substrate is disposed on a susceptor heated to 600° C. to 650° C. A first carrier gas is flowed into a manifold to combine with a plurality of metal organic precursors. The first carrier gas, the metal organic precursors, and a second carrier gas, are flowed through a vaporizer into a chamber of the MOCVD tool, over the substrate. A ratio of a flow rate of the first carrier gas to a flow rate of the metal organic precursors is 250 sccm/milliliter/minute to 500 sccm/milliliter/minute. A ratio of a flow rate of the second carrier gas to a flow rate of the metal organic precursors is 700 sccm/milliliter/minute to 1500 sccm/milliliter/minute. An oxidizing gas is flowed into the chamber over the substrate. The metal organic precursors and the oxidizing gas react to form the ferroelectric layer.

19 Claims, 7 Drawing Sheets

PROCESS TO ENABLE FERROELECTRIC LAYERS ON LARGE AREA SUBSTRATES

FIELD OF THE INVENTION

This invention relates to the field of microelectronic devices. More particularly, this invention relates to forming ferroelectric layers in microelectronic devices.

BACKGROUND OF THE INVENTION

Ferroelectric layers are formed in some microelectronic devices, for example in non-volatile memory devices. As wafer diameters increase in the microelectronic industry, it becomes desirable to form the ferroelectric layers on the larger wafers, for example 300 millimeter wafers, to accrue the associated lower fabrication costs. Forming ferroelectric layers with desired qualities such as uniform stoichiometry and orientation on larger substrates has been problematic. Loss of elements such as lead from the layers undesirably degrades stoichiometry uniformity. Stress in the ferroelectric layers produces unacceptable bow in larger wafers compared to smaller wafers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device with a ferroelectric layer is formed using a metal organic chemical vapor deposition (MOCVD) tool. A substrate of the microelectronic device is disposed on a susceptor of the MOCVD tool; the susceptor is heated to 600° C. to 650° C. A first carrier gas is flowed into a manifold to combine with a plurality of metal organic precursors in a liquid state. The first carrier gas and the metal organic precursors, and a second carrier gas, are flowed into a vaporizer. The first carrier gas and the second carrier gas are chemically inert with respect to the metal organic precursors. A ratio of a flow rate of the first carrier gas to a flow rate of the metal organic precursors in the liquid state is 250 standard cubic centimeters/minute/milliliter/minute (sccm/milliliter/minute) to 500 sccm/milliliter/minute. A ratio of a flow rate of the second carrier gas to a flow rate of the metal organic precursors in the liquid state is 700 sccm/milliliter/minute to 1500 sccm/milliliter/minute. The first carrier gas, the second carrier gas and the metal organic precursors are flowed from the vaporizer into a chamber of the MOCVD tool, over the substrate. An oxidizing gas is flowed into the chamber over the substrate. The metal organic precursors and the oxidizing gas react to form the ferroelectric layer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
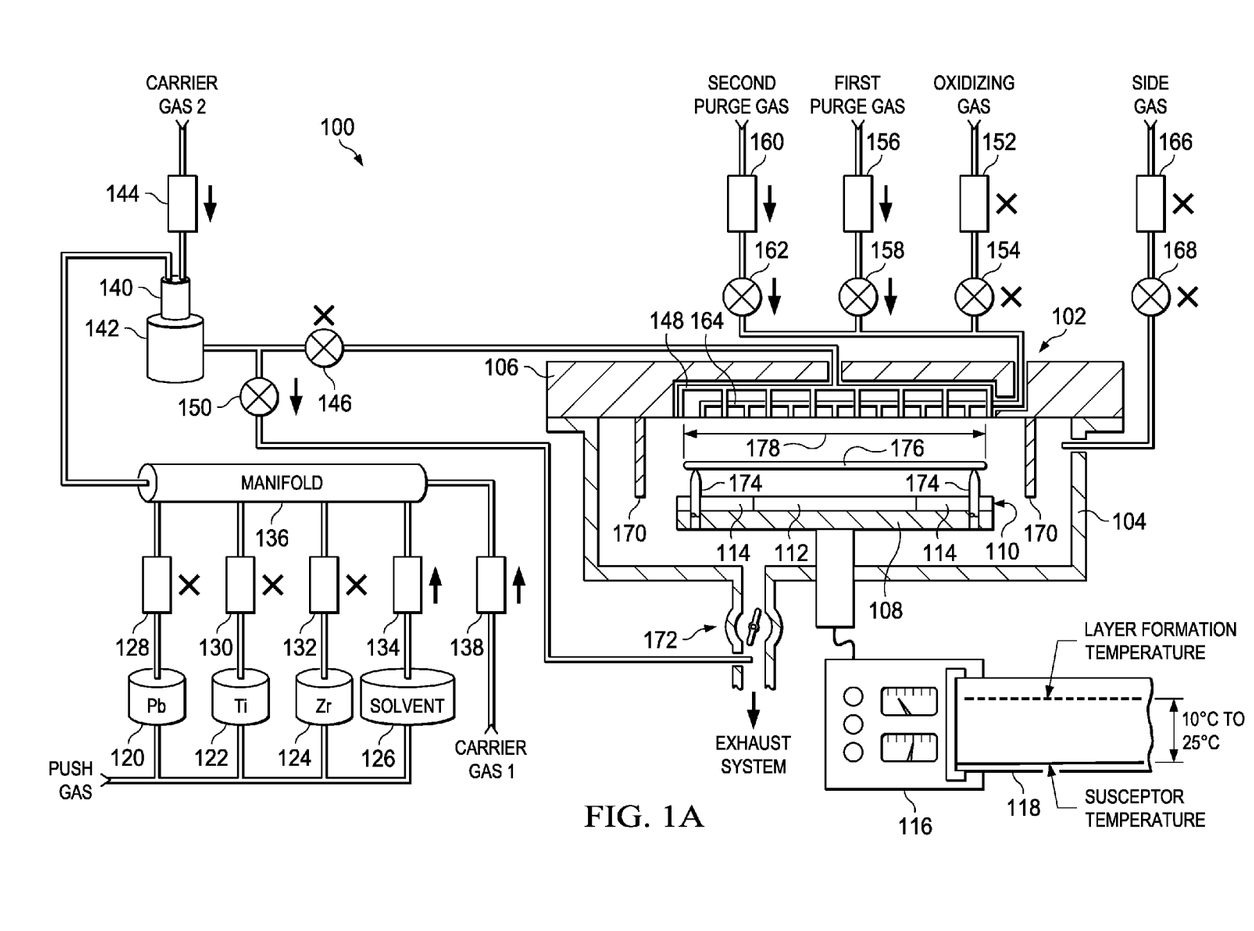
FIG. 1A through FIG. 1G depict successive stages of an example method of formation of a microelectronic device including a ferroelectric layer.

FIG. 1A through FIG. 1G depict successive stages of an example method of formation of a microelectronic device including a ferroelectric layer. Referring to FIG. 1A, an MOCVD tool 100 includes a chamber 102, possibly comprising a body 104 and a top plate 106 which seals against the body 104. A wafer chuck 108 is disposed in the chamber 102 with a susceptor 110 on the wafer chuck 108. The susceptor 110 may include an inner portion 112 surrounded by an outer portion 114. The susceptor 110 is heated by a heater controller 116 which may provide a temperature record 118 of a temperature of the susceptor 110.

A plurality of metal organic precursors are provided in a liquid state in separate precursor reservoirs. In the instant example, the reservoirs may include, for example, a lead precursor reservoir 120 containing a lead metal organic precursor and possibly a solvent, a titanium precursor reservoir 122 containing a titanium metal organic precursor and possibly more of the solvent, and a zirconium precursor reservoir 124 containing a zirconium metal organic precursor and possibly more of the solvent. The lead metal organic precursor may include lead bis (2,2,6,6-tetramethyl-3,5-heptanedionate) or lead bis(2,2,6,6-tetramethyl-3,5-heptanedionate) N,N',N"-pentamethyl diethylenetriamine, as disclosed by Gilbert et al. In U.S. Pat. No. 6,730,354, hereby incorporated by reference in its entirety. Alternatively, the lead metal organic precursor may include a lead sol gel formulation. The titanium metal organic precursor may include titanium bis (isopropoxide) bis(2,2,6,6-tetramethyl-3,5-heptanedionate) as disclosed by Gilbert et al. In U.S. Pat. No. 6,730,354, or may include a titanium sol gel formulation. The zirconium metal organic precursor may include zirconium tetrakis(2,2,6,6-tetramethyl-3,5-heptanedionate) or zirconium bis (isopropoxide) bis(2,2,6,6-tetramethyl-3,5-heptanedionate), as disclosed by Gilbert et al. In U.S. Pat. No. 6,730,354, or may include a zirconium sol gel formulation. A solvent such as a mixture of tetrahydrofuran, isopropanol and tetraethylene glycol dimethyl ether (tetraglyme), or a mixture of octane, decane and polyamine, is provided in a solvent reservoir 126. The same solvent may be provided in the precursor reservoirs 120, 122 and 124. Other metal organic precursors and other solvents are within the scope of the instant example. In other versions of the instant example, the metal organic precursors may include lanthanum, barium, and/or strontium.

A push gas, denoted in FIG. 1A through FIG. 1G as PUSH GAS, is provided to the precursor reservoirs, including the lead precursor reservoir 120, the titanium precursor reservoir 122, and the zirconium precursor reservoir 124, and to the solvent reservoir 126. The push gas provides pressure to deliver the metal organic precursors and the solvent to the MOCVD tool 100. The push gas is preferably chemically inert with respect to the metal organic precursors and the solvent; the push gas may comprise, for example, helium.

An output of each reservoir 120, 122, 124, and 126 may be separately connected to a corresponding liquid flow controller. In the instant example, the lead precursor reservoir 120 is connected to a lead precursor liquid flow controller 128, the titanium precursor reservoir 122 is connected to a titanium precursor liquid flow controller 130, the zirconium precursor reservoir 124 is connected to a zirconium precursor liquid flow controller 132, and the solvent reservoir 126 is connected to a solvent liquid flow controller 134. Outputs of the precursor liquid flow controllers 128, 130, 132 and 134 for the precursors and the solvent are connected to a manifold 136. A first carrier gas, denoted in FIG. 1A through FIG. 1G as CARRIER GAS 1, is provided through a first carrier gas mass flow controller 138 to the manifold 136. The first carrier gas is preferably chemically inert with respect to the metal organic precursors and the solvent; the first carrier gas may comprise, for example, argon.

An output of the manifold 136 is connected to a nozzle 140 of a vaporizer 142. A second carrier gas, denoted in FIG. 1A through FIG. 1G as CARRIER GAS 2, is provided through a second carrier gas mass flow controller 144 to the nozzle 140 of the vaporizer 142. The second carrier gas is also preferably chemically inert with respect to the metal organic precursors and the solvent; the second carrier gas may also comprise, for example, argon. An output of the vaporizer 142 is connected through a chamber valve 146 to a precursor distribution manifold 148 in the top plate 106 of the chamber 102. The precursor distribution manifold 148 is configured to uniformly distribute the metal organic precursors, the solvent, the first carrier gas and the second carrier gas through a showerhead in the top plate 106 into the chamber 102 over the susceptor 110. The output of the vaporizer 142 is also connected through a bypass valve 150 to an exhaust system of the MOCVD tool 100, denoted as EXHAUST SYSTEM in FIG. 1A through FIG. 1G.

An oxidizing gas, denoted in FIG. 1A through FIG. 1G as OXIDIZING GAS, is provided through a oxidizing gas mass flow controller 152 in series with an oxidizing gas valve 154. The oxidizing gas may comprise, for example, oxygen gas, nitrous oxide gas, and/or ozone. A first purge gas, denoted in FIG. 1A through FIG. 1G as FIRST PURGE GAS, is provided through a first purge mass flow controller 156 in series with a first purge valve 158. The first purge gas may comprise, for example, argon. A second purge gas, denoted in FIG. 1A through FIG. 1G as SECOND PURGE GAS, is provided through a second purge mass flow controller 160 in series with an second purge valve 162. The second purge gas may comprise, for example, nitrogen. The output ports of the oxidizing gas valve 154, the first purge valve 158 and the second purge valve 162 are connected together and to an oxidizing gas/purge gas distribution manifold 164 in the top plate 106 of the chamber 102. The oxidizing gas/purge gas distribution manifold 164 is configured to uniformly distribute the oxidizing gas through the showerhead in the top plate 106 into the chamber 102 over the susceptor 110.

A side gas, denoted in FIG. 1A through FIG. 1G as SIDE GAS, is provided through a side gas mass flow controller 166 in series with a side gas valve 168 to the chamber 102. The side gas is preferably chemically inert with respect to the metal organic precursors and the solvent. The side gas may comprise, for example, nitrogen and/or argon. An output port of the side gas valve 168 is connected to distribution ports distributed around a perimeter of the body 104 of the chamber 102. A side gas buffer ring 170 extends from the top plate 106 around a perimeter of the susceptor 110 and is configured to direct the side gas downward around the perimeter of the chamber 102.

Pressure in the chamber 102 is controlled by an exhaust valve 172 between the body 104 and the exhaust system. The exhaust system may include, for example, a foreline pump, a high vacuum pump, and one or more cold traps.

At the start of the instant example method, all of the precursor liquid flow controllers 128, 130 and 132 are adjusted to shut off flow of the metal organic precursors, as indicated in FIG. 1A by the "X" beside each precursor liquid flow controller. The solvent liquid flow controller 134 is adjusted to provide a flow rate of the solvent of, for example, 0.5 milliliters/minute (ml/min) to 1.5 ml/min, from the solvent reservoir 126 into the manifold 136, as indicated by the flow arrow next to the solvent liquid flow controller 134 in FIG. 1A. The first carrier gas mass flow controller 138 is adjusted to provide a flow rate of the first carrier gas of, for example, 600 standard cubic centimeters/minute (sccm) to 1000 sccm, into the manifold 136, as indicated by the flow arrow next to the first carrier gas mass flow controller 138 in FIG. 1A. The solvent is converted into liquid droplets in the manifold 136 and flows with the first carrier gas to the nozzle 140 of the vaporizer 142. The second carrier gas mass flow controller 144 is adjusted to provide a flow rate of the second carrier gas of, for example, 250 sccm to 500 sccm, into the nozzle 140, as indicated by the flow arrow next to the second carrier gas mass flow controller 144 in FIG. 1A. The flow rates of the first carrier gas and the second carrier gas may be adjusted so that a ratio of the flow rate of the first carrier gas to the flow rate of the second carrier gas is 2.0 to 2.5. The vaporizer 142 is maintained at a temperature of 200° C. to 250° C., so that the solvent flowing through the nozzle 140 and through the vaporizer 142 is converted to a gaseous phase. The chamber valve 146 is turned off, as indicated by the "X" next to the chamber valve 146 in FIG. 1A, and the bypass valve 150 is turned on, as indicated by the flow arrow next to the bypass valve 150 in FIG. 1A, so that the solvent, the first carrier gas and the second carrier gas flow to the exhaust system.

The oxidizing gas valve 154 is turned off and the oxidizing gas mass flow controller 152 is adjusted to zero flow rate, as indicated by the "X"s next to the oxidizing gas valve 154 and the oxidizing gas mass flow controller 152 in FIG. 1A, so that no oxidizing gas flows to the oxidizing gas/purge gas distribution manifold 164. The first purge valve 158 is turned on and the first purge mass flow controller 156 is adjusted to provide a flow rate of the first purge gas of, for example, 1000 sccm to 2000 sccm, through the oxidizing gas/purge gas distribution manifold 164 into the chamber 102, as indicated by the flow arrows next to the first purge valve 158 and the first purge mass flow controller 156 in FIG. 1A. The second purge valve 162 is turned on and the second purge mass flow controller 160 is adjusted to provide a flow rate of the first purge gas of, for example, 200 sccm to 400 sccm, through the oxidizing gas/purge gas distribution manifold 164 into the chamber 102, as indicated by the flow arrows next to the second purge valve 162 and the second purge mass flow controller 160 in FIG. 1A.

In the instant example, the side gas valve 168 may be turned off, and the side gas mass flow controller 166 may be adjusted to provide zero flow, as indicated by the "X"s next to the side gas valve 168 and the side gas mass flow controller 166 in FIG. 1A, so that no side gas is provided to the chamber 102. Alternatively, the side gas valve 168 may be turned on, and the side gas mass flow controller 166 may be adjusted to provide a flow rate of, for example, 50 sccm to 100 sccm, into the chamber 102 between the body 104 and the side gas buffer ring 170.

The exhaust valve 172 is adjusted to provide a pressure in the chamber 102 less than 150 millitorr. The exhaust valve 172 may be controlled to maintain a desired pressure within a desired range, or may be opened to attain as low a pressure as possible.

The heater controller 116 adjusts the temperature of the inner portion 112 of the susceptor 110 to a temperature 10° C. to 25° C. cooler than a temperature of the susceptor during subsequent formation of the ferroelectric layer, as indicated on the temperature record 118. The heater controller 116 adjusts a temperature of the outer portion 114 of the susceptor 110 to be within 10° C. of the temperature of the inner portion 112. For example, in a version of the instant example in which the temperature of the inner portion 112 of the susceptor 110 is 625° C. while the ferroelectric layer is formed, the heater controller 116 adjusts the temperature of the inner portion 112 of the susceptor 110 to a temperature of 600° C. to 615° C. at the start of the instant example method, depicted in FIG. 1A. Maintaining the temperature of the inner portion 112 of the susceptor 110 at the temperature 10° C. to 25° C. cooler than the temperature of the susceptor during subsequent formation of the ferroelectric layer has been demonstrated to advantageously maintain a stable temperature of the showerhead for MOCVD tools capable of handling 300 millimeter wafers, improving cycle time and repeatability of the ferroelectric layers.

Wafer lift pins 174 extend at least 2 millimeters above the susceptor 110. A substrate 176 of the microelectronic device, which may be, for example, a semiconductor wafer, is transferred into the chamber 102 and is disposed on the wafer lift pins 174 while the pressure in the chamber 102 is maintained at less than 150 millitorr. A diameter 178 of the substrate 176 may be at least about 300 millimeters. It is to be understood that the term "at least about 300 millimeters" applies to a semiconductor wafer with a nominal diameter of 300 millimeters, even though a precise measurement of the diameter may provide a diameter slightly less than 300 millimeters. Tests performed in pursuit of the instant example have shown that maintaining the pressure in the chamber 102 at less than 150 millitorr while the substrate 176 with a diameter of at least about 300 millimeters is transferred into the chamber 102 and is disposed on the wafer lift pins 174 may advantageously reduce position errors of the substrate 176 on the wafer lift pins 174, compared to higher pressures which may cause unintended aerodynamic gliding of the substrate 176.

Figure 1B:
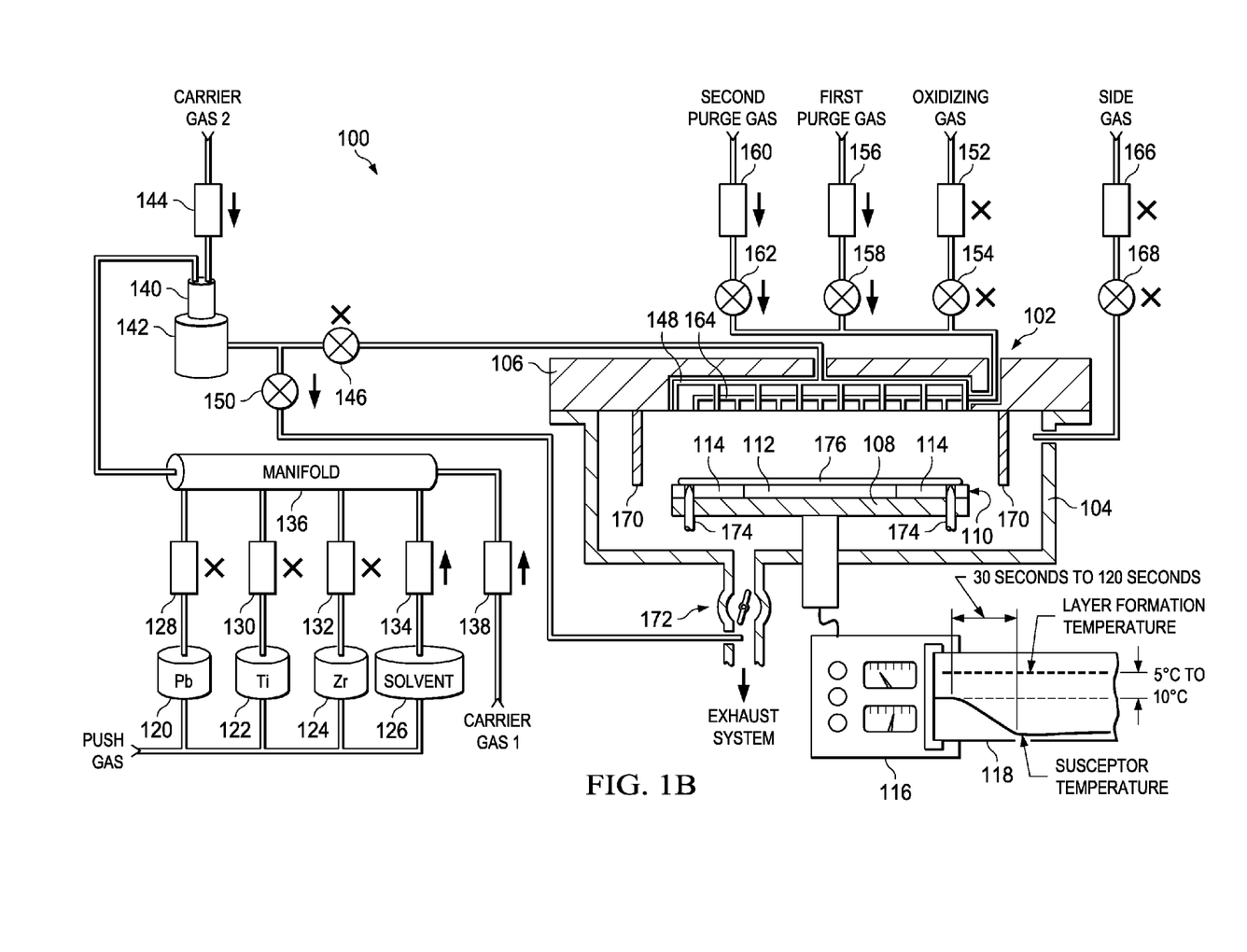

Referring to FIG. 1B, all of the precursor liquid flow controllers 128, 130 and 132 are kept off to shut off flow of the metal organic precursors. The solvent liquid flow controller 134 provides the same flow rate of the solvent from the solvent reservoir 126 into the manifold 136. The first carrier gas mass flow controller 138 provides the same flow rate of the first carrier gas into the manifold 136. The second carrier gas mass flow controller 144 provides the same flow rate of the second carrier gas into the nozzle 140. The chamber valve 146 is kept off and the bypass valve 150 is kept on, so that the solvent, the first carrier gas and the second carrier gas continue to flow to the exhaust system.

The oxidizing gas valve 154 is kept off and the oxidizing gas mass flow controller 152 is kept at zero flow rate, so that no oxidizing gas flows to the oxidizing gas/purge gas distribution manifold 164. The first purge valve 158 is kept on and the first purge mass flow controller 156 provides the same flow rate of the first purge gas through the oxidizing gas/purge gas distribution manifold 164 into the chamber 102. The second purge valve 162 is kept on and the second purge mass flow controller 160 provides the same flow rate of the first purge gas through the oxidizing gas/purge gas distribution manifold 164 into the chamber 102.

The side gas valve 168 and the side gas mass flow controller 166 may be maintained in the same states as in the previous step, to avoid any changes in pressure in the chamber 102 while the substrate 176 is raised off the susceptor 110 by the wafer lift pins 174. The exhaust valve 172 may maintained in the same state as the previous step to provide a pressure in the chamber 102 less than 150 millitorr, while the substrate 176 is raised off the susceptor 110.

The wafer lift pins 174 are lowered so that the substrate 176 is disposed on the susceptor 110 while the pressure in the chamber 102 is maintained at less than 150 millitorr. Tests performed in pursuit of the instant example have shown that maintaining the pressure in the chamber 102 at less than 150 millitorr while the substrate 176 with a diameter of at least about 300 millimeters is disposed on the susceptor 110 may advantageously reduce position errors of the substrate 176 on the susceptor 110, compared to higher pressures which may cause unintended aerodynamic gliding of the substrate 176.

After the substrate 176 is disposed on the susceptor 110, the heater controller 116 raises the temperature of the inner portion 112 of the susceptor 110 to 5° C. to 10° C. cooler than the temperature of the susceptor during subsequent formation of the ferroelectric layer, over a time period of 30 seconds to 120 seconds, as indicated on the temperature record 118. The heater controller 116 adjusts a temperature of the outer portion 114 of the susceptor 110 to be within 10° C. of the temperature of the inner portion 112. For example, in a version of the instant example in which the temperature of the inner portion 112 of the susceptor 110 is 625° C. while the ferroelectric layer is formed, the heater controller 116 raises the temperature of the inner portion 112 of the susceptor 110 to a temperature of 615° C. to 620° C. after the substrate 176 is disposed on the susceptor 110, depicted in FIG. 1B. Raising the temperature of the susceptor 110 after the substrate 176 is disposed on the susceptor 110 over a time period of 30 seconds to 120 seconds has been demonstrated to advantageously reduce thermal stress on the substrate 176, especially for 300 millimeter and larger semiconductor wafers, in tests performed in pursuit of the instant example.

Figure 1C:
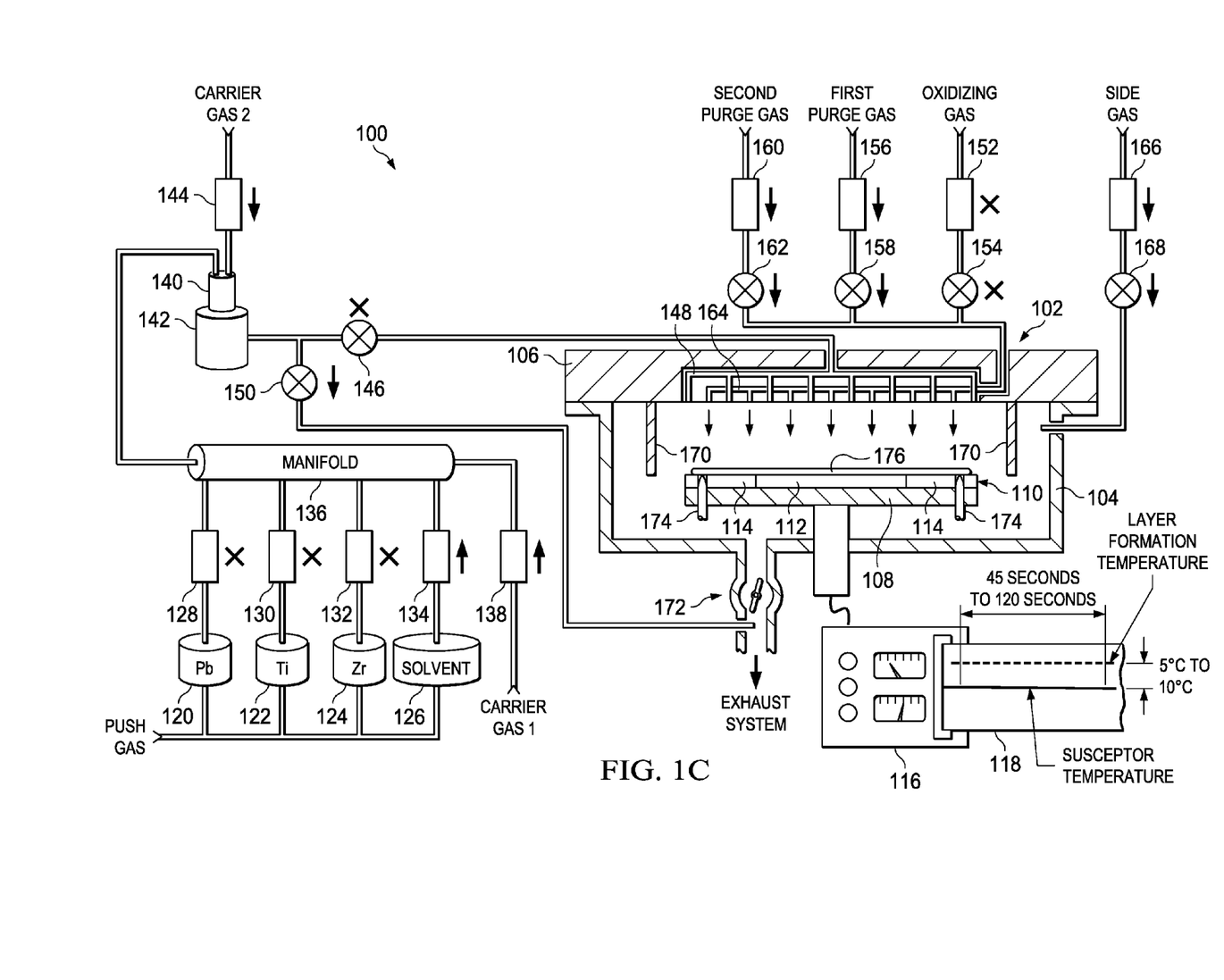

Referring to FIG. 1C, all of the precursor liquid flow controllers 128, 130 and 132 are kept off to shut off flow of the metal organic precursors. The solvent liquid flow controller 134 provides the same flow rate of the solvent from the solvent reservoir 126 into the manifold 136. The first carrier gas mass flow controller 138 provides the same flow rate of the first carrier gas into the manifold 136. The second carrier gas mass flow controller 144 provides the same flow rate of the second carrier gas into the nozzle 140. The chamber valve 146 is kept off and the bypass valve 150 is kept on, so that the solvent, the first carrier gas and the second carrier gas continue to flow to the exhaust system.

The oxidizing gas valve 154 is kept off and the oxidizing gas mass flow controller 152 is kept at zero flow rate, so that no oxidizing gas flows to the oxidizing gas/purge gas distribution manifold 164. The first purge valve 158 is kept on and the first purge mass flow controller 156 is adjusted to provide a higher flow rate of the first purge gas, for example 4000 sccm to 5000 sccm, through the oxidizing gas/purge gas distribution manifold 164 into the chamber 102. The flow rate of the first purge gas may be selected to be similar to a flow rate of the oxidizing gas during formation of the ferroelectric layer. The second purge valve 162 is kept on and the second purge mass flow controller 160 provides the same flow rate of the first purge gas through the oxidizing gas/purge gas distribution manifold 164 into the chamber 102.

The side gas valve 168 is turned on if it is not already on, and the side gas mass flow controller 166 is adjusted, if necessary, to provide a flow rate of the side gas of, for example 50 sccm to 100 sccm, into the chamber 102 between the body 104 and the side gas buffer ring 170.

The exhaust valve 172 may be adjusted to provide a pressure in the chamber 102 similar to a pressure during formation of the ferroelectric layer, for example, 1.5 torr to 4 torr. The heater controller 116 maintains the temperature of the inner portion 112 of the susceptor 110 to 5° C. to 10° C. cooler than the temperature of the susceptor during subsequent formation of the ferroelectric layer, as indicated on the temperature record 118. The heater controller 116 maintains the temperature of the outer portion 114 of the susceptor 110 to be within 10° C. of the temperature of the inner portion 112. The pressure is maintained for a period of time to raise the temperature of the substrate 176 to a stable value, for example 45 seconds to 120 seconds.

Figure 1D:
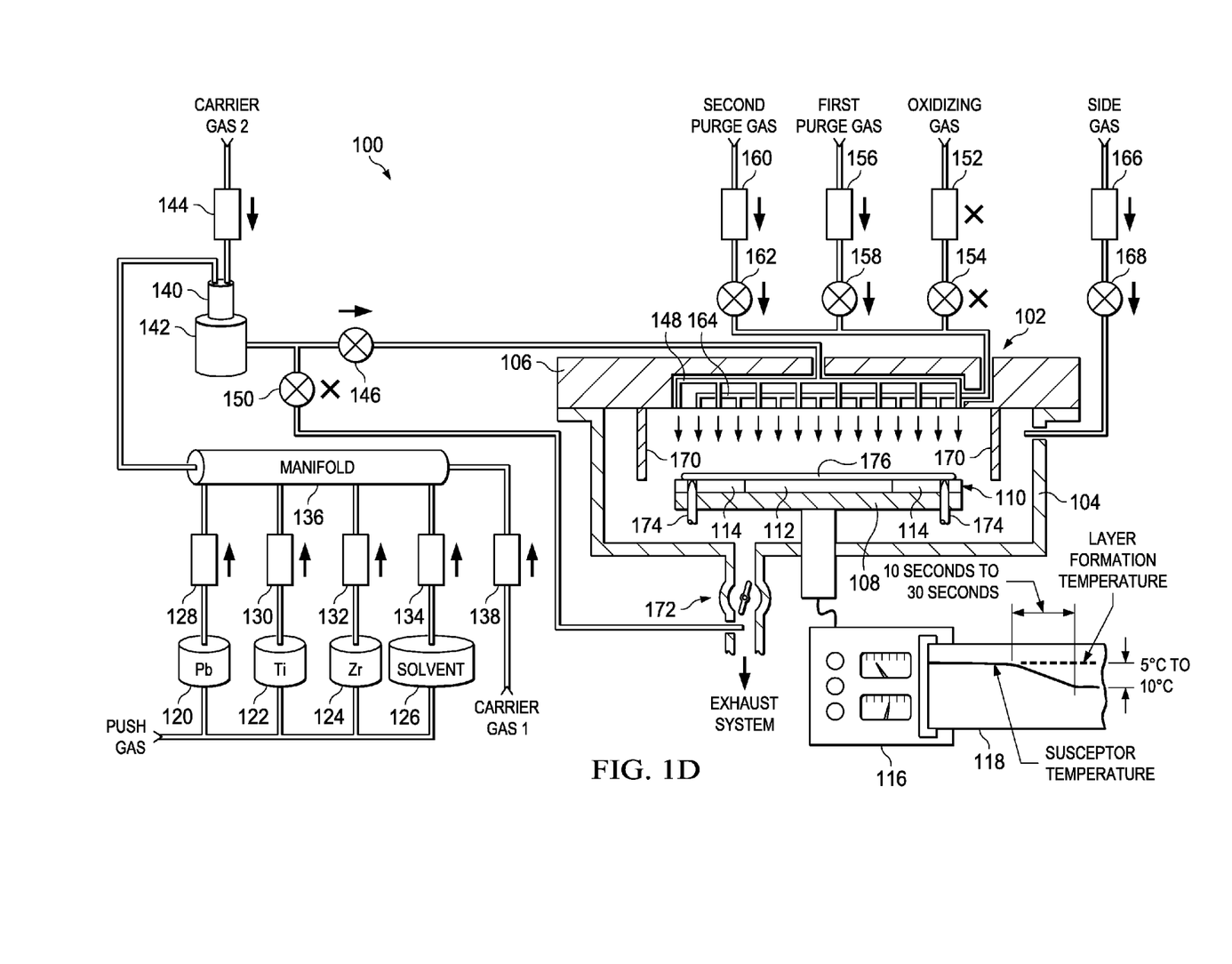

Referring to FIG. 1D, the lead precursor liquid flow controller 128, the titanium precursor liquid flow controller 130 and the zirconium precursor liquid flow controller 132 are adjusted to provide flow rates of the corresponding metal organic precursors substantially equal to flow rates of the metal organic precursors during formation of the ferroelectric layer. The lead precursor liquid flow controller 128 may be adjusted to provide a flow rate of the lead metal organic precursor of, for example, 0.25 milliliters/minute to 0.6 milliliters/minute, from the lead precursor reservoir 120 to the manifold 136. The titanium precursor liquid flow controller 130 may be adjusted to provide a flow rate of the titanium metal organic precursor of, for example, 0.1 milliliters/minute to 0.35 milliliters/minute, from the titanium precursor reservoir 122 to the manifold 136. The zirconium precursor liquid flow controller 132 may be adjusted to provide a flow rate of the zirconium metal organic precursor of, for example, 0.15 milliliters/minute to 0.45 milliliters/minute, from the zirconium precursor reservoir 124 to the manifold 136. A total flow rate of the metal organic precursors in the liquid state during formation of the ferroelectric layer may be 1.0 milliliter/minute to 3.0 milliliter/minute, which has been shown to provide uniformity of stoichiometry better than 97% on 300 millimeter diameter wafers, in tests performed in pursuit of the instant example.

The solvent liquid flow controller 134 is adjusted to reduce the flow rate of the solvent, for example, 0.15 milliliters/minute to 0.4 milliliters/minute, from the solvent reservoir 126 into the manifold 136. The flow rates of the precursor liquid flow controllers 128, 130 and 132 depend on a desired stoichiometry of the ferroelectric layer.

The first carrier gas mass flow controller 138 provides the same flow rate of the first carrier gas as in the previous step, described in reference to FIG. 1C, into the manifold 136. The solvent and the metal organic precursors are converted into liquid droplets in the manifold 136 and flow with the first carrier gas to the nozzle 140 of the vaporizer 142. Similarly, the second carrier gas mass flow controller 144 provides the same flow rate of the second carrier gas as in the previous step, described in reference to FIG. 1C, into the nozzle 140. The vaporizer 142 is maintained at a temperature of 200° C. to 250° C., so that the solvent and the metal organic precursors flowing through the nozzle 140 and through the vaporizer 142 are converted to a gaseous phase. The chamber valve 146 is turned on and the bypass valve 150 is turned off, so that the solvent, the metal organic precursors, the first carrier gas and the second carrier gas flow to the precursor distribution manifold 148 and into the chamber 102 over the substrate 176.

The oxidizing gas valve 154 is kept off and the oxidizing gas mass flow controller 152 is kept at zero flow rate, so that no oxidizing gas flows to the oxidizing gas/purge gas distribution manifold 164. The first purge valve 158 is kept on and the first purge mass flow controller 156 is maintained to provide the higher flow rate of the first purge gas, described in reference to FIG. 1C, through the oxidizing gas/purge gas distribution manifold 164 into the chamber 102. The second purge valve 162 is kept on and the second purge mass flow controller 160 provides the same flow rate of the first purge gas through the oxidizing gas/purge gas distribution manifold 164 into the chamber 102. The side gas valve 168 is kept on, and the side gas mass flow controller 166 is maintained to provide the same flow rate of the side gas into the chamber 102 between the body 104 and the side gas buffer ring 170. The flow rates and pressure are maintained for a period of time to provide a stable flow of the metal organic precursors into the chamber 102, for example 45 seconds to 120 seconds. The exhaust valve 172 may be adjusted to provide a pressure in the chamber 102 similar to a pressure during formation of the ferroelectric layer, for example, 1.5 torr to 4 torr.

The heater controller 116 adjusts the temperature of the inner portion 112 of the susceptor 110 to the temperature of the susceptor during subsequent formation of the ferroelectric layer, over a time period of 10 seconds to 30 seconds, as indicated on the temperature record 118. The heater controller 116 maintains the temperature of the outer portion 114 of the susceptor 110 to be within 5° C. of the temperature of the inner portion 112. Raising the temperature of the susceptor 110 to the temperature of the susceptor during subsequent formation of the ferroelectric layer over a time period of 10 seconds to 30 seconds has been demonstrated to advantageously reduce thermal stress on the substrate 176, especially for 300 millimeter and larger semiconductor wafers, in tests performed in pursuit of the instant example.

Figure 1E:
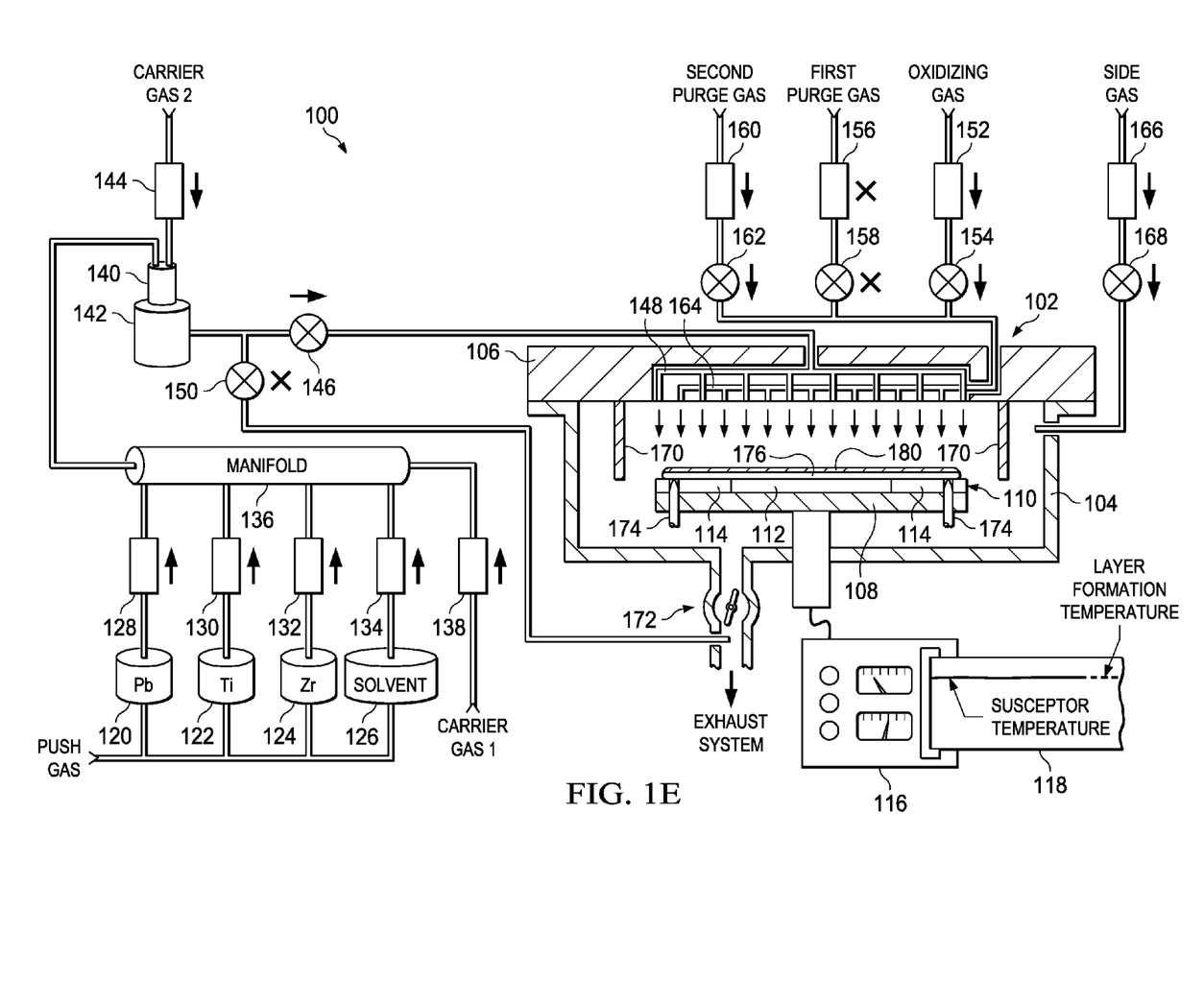

Referring to FIG. 1E, the lead precursor liquid flow controller 128, the titanium precursor liquid flow controller 130 and the zirconium precursor liquid flow controller 132 are maintained to provide the desired flow rates of the corresponding metal organic precursors for formation of the ferroelectric layer, described in reference to FIG. 1D. The solvent liquid flow controller 134 is maintained to provide the reduced flow rate of the solvent described in reference to FIG. 1D.

The first carrier gas mass flow controller 138 maintains the same flow rate of the first carrier gas as in the previous step, described in reference to FIG. 1C, into the manifold 136. A ratio of the flow rate of the first carrier gas to the total flow rate of the metal organic precursors in the liquid state is 250 sccm/milliliter/minute to 500 sccm/milliliter/minute. The solvent and the metal organic precursors are converted into liquid droplets in the manifold 136 and flow with the first carrier gas to the nozzle 140 of the vaporizer 142. Similarly, the second carrier gas mass flow controller 144 maintains the same flow rate of the second carrier gas as in the previous step, described in reference to FIG. 1C, into the nozzle 140. A ratio of the flow rate of the second carrier gas to the total flow rate of the metal organic precursors in the liquid state is 700 sccm/milliliter/minute to 1500 sccm/milliliter/minute. The vaporizer 142 is maintained at a temperature of 200° C. to 250° C., so that the solvent and the metal organic precursors flowing through the nozzle 140 and through the vaporizer 142 are converted to a gaseous phase. The chamber valve 146 is kept on and the bypass valve 150 is kept off, so that the solvent, the metal organic precursors, the first carrier gas and the second carrier gas continue to flow to the precursor distribution manifold 148 and into the chamber 102 over the substrate 176.

The oxidizing gas valve 154 is turned on and the oxidizing gas mass flow controller 152 is adjusted to provide a flow rate of, for example, 4000 sccm to 5000 sccm, into the oxidizing gas/purge gas distribution manifold 164. A ratio of the flow rate of the oxidizing gas to the total flow rates of the metal organic precursors is greater than 3000 sccm/milliliters/minute. The first purge valve 158 is turned off and the first purge mass flow controller 156 is adjusted to provide a zero flow rate of the first purge gas. The second purge valve 162 is kept on and the second purge mass flow controller 160 provides the same flow rate of the first purge gas through the oxidizing gas/purge gas distribution manifold 164 into the chamber 102. Thus, the total flow rate through the oxidizing gas/purge gas distribution manifold 164 remains substantially constant.

The side gas valve 168 is kept on, and the side gas mass flow controller 166 is maintained to provide the same flow rate of the side gas into the chamber 102 between the body 104 and the side gas buffer ring 170. The exhaust valve 172 is maintained to provide a desired pressure in the chamber 102 for formation of the ferroelectric layer, for example, 1.5 torr to 4 torr. The heater controller 116 maintains the temperature of the inner portion 112 of the susceptor 110 to the desired temperature of the susceptor for formation of the ferroelectric layer, as indicated on the temperature record 118. The heater controller 116 maintains the temperature of the outer portion 114 of the susceptor 110 to be within 5° C. of the temperature of the inner portion 112.

The oxidizing gas and the metal organic precursors react at the substrate 176 to form the ferroelectric layer 180 on the substrate 176. The flow rates and pressure are maintained to form the ferroelectric layer 180 with a desired thickness. Providing the ratio of the flow rate of the oxidizing gas to the total flow rates of the metal organic precursors greater than 3000 sccm/milliliters/minute has been shown in tests performed in pursuit of the instant example to provide a desired uniformity of crystalline orientation of the ferroelectric layer 180. Providing the ratio of the flow rate of the first carrier gas to the total flow rate of the metal organic precursors in the liquid state of 250 sccm/milliliter/minute to 500 sccm/milliliter/minute, and providing the ratio of the flow rate of the second carrier gas to the total flow rate of the metal organic precursors in the liquid state of 700 sccm/milliliter/minute to 1500 sccm/milliliter/minute has been shown in tests performed in pursuit of the instant example to provide a uniformity of stoichiometry of the ferroelectric layer 180 across the substrate 176 higher than 97 percent.

Figure 1F:
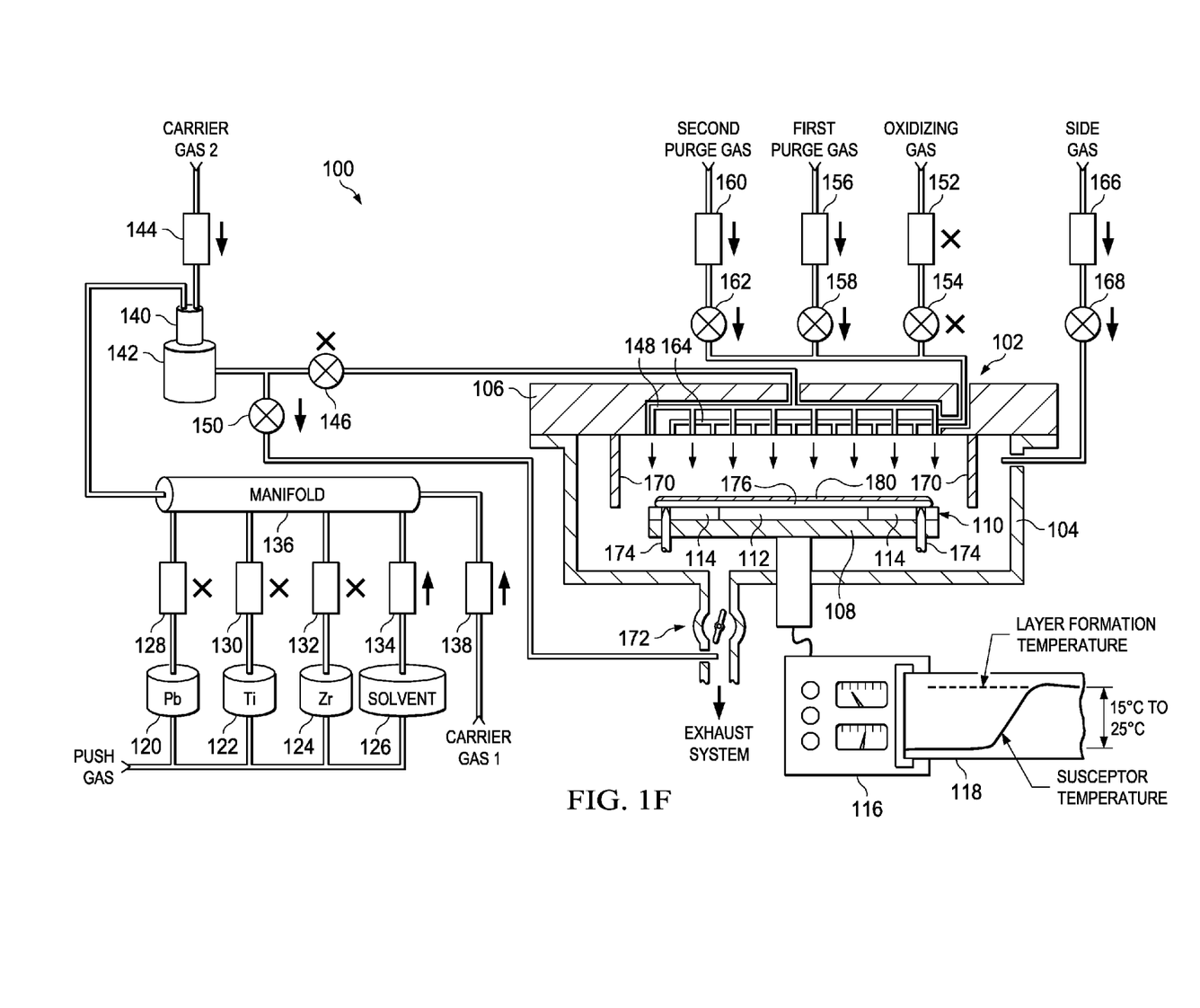

Referring to FIG. 1F, after the ferroelectric layer 180 is formed, the lead precursor liquid flow controller 128, the titanium precursor liquid flow controller 130 and the zirconium precursor liquid flow controller 132 are adjusted to provide zero flow rates of the corresponding metal organic precursors. The solvent liquid flow controller 134 is adjusted to increase the flow rate of the solvent, for example, 0.5 milliliters/minute (ml/min) to 1.5 ml/min, from the solvent reservoir 126 into the manifold 136. The first carrier gas mass flow controller 138 provides the same flow rate of the first carrier gas as in the previous step, into the manifold 136. Similarly, the second carrier gas mass flow controller 144 provides the same flow rate of the second carrier gas as in the previous step. The chamber valve 146 is turned off and the bypass valve 150 is turned on, so that the solvent, the first carrier gas and the second carrier gas flow to exhaust system.

The oxidizing gas valve 154 is turned off and the oxidizing gas mass flow controller 152 is adjusted to zero flow rate, so that no oxidizing gas flows to the oxidizing gas/purge gas distribution manifold 164. The first purge valve 158 is turned on and the first purge mass flow controller 156 is adjusted to provide a flow rate substantially equal to the flow rate of the oxidizing gas during formation of the ferroelectric layer 180. The second purge valve 162 is kept on and the second purge mass flow controller 160 provides the same flow rate as during formation of the ferroelectric layer 180. Thus, the total flow rate through the oxidizing gas/purge gas distribution manifold 164 into the chamber 102 remains substantially equal to the flow rate during formation of the ferroelectric layer 180. The side gas valve 168 is kept on, and the side gas mass flow controller 166 is maintained to provide the same flow rate of the side gas into the chamber 102 between the body 104 and the side gas buffer ring 170. The first purge gas, the second purge gas and the side gas provide a non-oxidizing ambient over the substrate 176, which advantageously reduces degradation of the ferroelectric layer 180.

The exhaust valve 172 is adjusted to provide a pressure in the chamber 102 of at least 2 torr of the non-oxidizing ambient over the substrate 176. The heater controller 116 reduces the temperature of the inner portion 112 of the susceptor 110 by 15° C. to 25° C., as indicated on the temperature record 118. The heater controller 116 maintains the temperature of the outer portion 114 of the susceptor 110 to be within 5° C. of the temperature of the inner portion 112. The flow rates and pressure are maintained for a period of time sufficient for a temperature of the ferroelectric layer 180 to reduce by at least 15° C., and to clear the metal organic precursors and the oxidizing gas from the chamber 102, for example 20 seconds to 45 seconds. Maintaining the pressure in the chamber 102 of at least 2 torr of the non-oxidizing ambient during cooldown of the ferroelectric layer 180 has been shown in tests performed in pursuit of the instant example to reduce loss of elements from the ferroelectric layer 180, thereby advantageously maintaining a desired uniformity of stoichiometry.

Figure 1G:
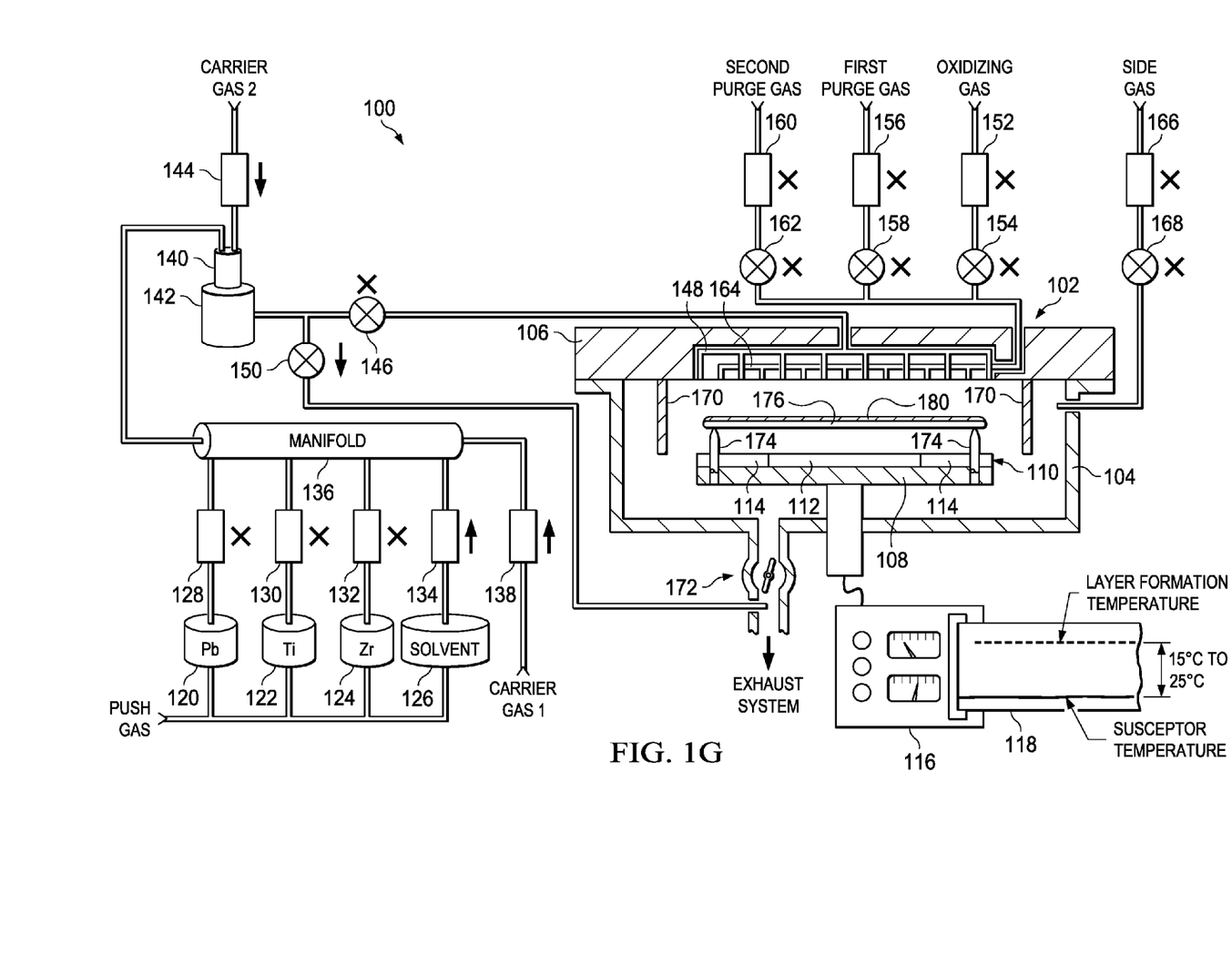

Referring to FIG. 1G, the lead precursor liquid flow controller 128, the titanium precursor liquid flow controller 130 and the zirconium precursor liquid flow controller 132 remain at zero flow rates of the corresponding metal organic precursors. The solvent liquid flow controller 134 may remain at the increased flow rate of the solvent that was set in the previous step, described in reference to FIG. 1F. The first carrier gas mass flow controller 138 provides the same flow rate of the first carrier gas as in the previous step, into the manifold 136. Similarly, the second carrier gas mass flow controller 144 provides the same flow rate of the second carrier gas as in the previous step. The chamber valve 146 is turned off and the bypass valve 150 is turned on, so that the solvent, the first carrier gas and the second carrier gas flow to exhaust system.

The oxidizing gas valve 154 remains off and the oxidizing gas mass flow controller 152 remains at zero flow rate, so that no oxidizing gas flows to the oxidizing gas/purge gas distribution manifold 164. The first purge valve 158 is turned off and the first purge mass flow controller 156 is set at zero flow rate. The second purge valve 162 is turned off and the second purge mass flow controller 160 is set to zero flow rate. The side gas valve 168 is turned off, and the side gas mass flow controller 166 is set at zero flow rate of the side gas into the chamber 102.

The exhaust valve 172 is opened to reduce the pressure in the chamber 102 below 150 millitorr. The heater controller 116 remains set to keep the susceptor 110 at the reduced temperature described in reference to FIG. 1F, as indicated on the temperature record 118. The heater controller 116 maintains the temperature of the outer portion 114 of the susceptor 110 to be within 5° C. of the temperature of the inner portion 112. After the pressure in the chamber 102 is reduced to below 150 millitorr, the substrate 176 is raised by the wafer lift pins 174 off the susceptor 110. The substrate 176 is subsequently transferred out of the chamber 102 while the pressure in the chamber 102 is maintained below 150 millitorr. Maintaining the pressure in the chamber 102 below 150 millitorr has been shown in tests performed in pursuit of the instant example to reduce unwanted movement of the substrate 176, especially in cases in which the substrate 176 is a 300 millimeter wafer. Reducing unwanted movement of the substrate 176 may advantageously reduce incidence of equipment jamming, work flow stoppage and wafer breakage.

The process disclosed herein may advantageously provide an average roughness of the ferroelectric layer 180 less than 4.5 nanometers across a 300 millimeter wafer. Further, the disclosed process may provide X-ray diffraction data indicating a desired fraction of the ferroelectric layer 180 on a 300 millimeter wafer has a 100 crystal orientation, comparable to production processes on 200 millimeter wafers. The disclosed process may also provide superior adhesion of the ferroelectric layer 180 compared to processes using lower ratios of the flow rate of the oxidizing gas to the total flow rates of the metal organic precursors. The disclosed process may provide a defect density for integrated circuits using the ferroelectric layer 180 of less than 0.5 defects $cm^{-2}$.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a microelectronic device, comprising the steps:
   disposing a substrate of the microelectronic device on a susceptor in a chamber of a metal organic chemical vapor deposition (MOCVD) tool;
   flowing a first carrier gas into a manifold to combine with a plurality of metal organic precursors in a liquid state, the first carrier gas being chemically inert with respect to the metal organic precursors, a ratio of a flow rate of the first carrier gas to a flow rate of the metal organic precursors in the liquid state being 250 standard cubic centimeters/minute/milliliter/minute (sccm/milliliter/minute) to 500 sccm/milliliter/minute;
   flowing the first carrier gas combined with the metal organic precursors into a vaporizer, and flowing a second carrier gas into the vaporizer, to convert the metal organic precursors to a gaseous state, the second carrier gas being chemically inert with respect to the metal organic precursors, a ratio of a flow rate of the second carrier gas to a flow rate of the metal organic precursors in the liquid state being 700 sccm/milliliter/minute to 1500 sccm/milliliter/minute;
   flowing the first carrier gas, the second carrier gas and the metal organic precursors in the gaseous state into the chamber over the substrate, and flowing an oxidizing gas into the chamber over the substrate while the susceptor is heated to 600° C. to 650° C., to form a ferroelectric layer on the substrate; and
   removing the substrate from the MOCVD tool.

2. The method of claim 1, wherein the substrate is a semiconductor wafer with a diameter of at least 300 millimeters.

3. The method of claim 1, comprising maintaining the susceptor of the MOCVD tool at a reduced temperature before the substrate is disposed into the chamber, the reduced temperature being 10° C. to 25° C. cooler than the temperature of the susceptor during formation of the ferroelectric layer.

4. The method of claim 1, wherein the step of disposing the substrate in the chamber comprises:
   maintaining a pressure of less than 150 millitorr in the chamber;
   disposing the substrate on wafer lift pins, the lift pins being in a raised position so that the substrate is disposed more than 2 mm above the susceptor, while the pressure is maintained at less than 150 millitorr; and
   lowering the lift pins so as to dispose the substrate on the susceptor while the pressure is maintained at less than 150 millitorr.

5. The method of claim 1, comprising:
   disposing the substrate on the susceptor;
   raising the temperature of the susceptor from 10° C. to 25° C. below the temperature of the susceptor during formation of the ferroelectric layer to within 5° C. of the temperature of the susceptor during formation of the ferroelectric layer, over a time period of 30 seconds to 120 seconds, before forming the ferroelectric layer;
   maintaining the temperature of the susceptor within 5° C. of the temperature of the susceptor during formation of the ferroelectric layer, over a time period of 45 seconds to 120 seconds, before forming the ferroelectric layer; and
   subsequently raising the temperature of the susceptor to the temperature of the susceptor during formation of the ferroelectric layer, over a time period of 10 seconds to 30 seconds.

6. The method of claim 1, wherein the step of flowing the plurality of metal organic precursors into the chamber comprises controlling flow rates of the metal organic precursors separately in a liquid state and flowing the metal organic precursors separately in the liquid state to a vaporizer.

7. The method of claim 1, wherein a ratio of a flow rate of the oxidizing gas into the chamber to a combined flow rate of the metal organic precursors in a liquid state is greater than 3000 sccm/milliliter/minute.

8. The method of claim 1, wherein the oxidizing gas is oxygen.

9. The method of claim 1, wherein the plurality of metal organic precursors comprises a metal organic precursor including lead.

10. The method of claim 1, wherein the plurality of metal organic precursors comprises a metal organic precursor including titanium and a metal organic precursor including zirconium.

11. The method of claim 1, wherein a total flow rate of the metal organic precursors in the liquid state during formation of the ferroelectric layer is 1.0 milliliter/minute to 3.0 milliliter/minute.

12. The method of claim 1, comprising flowing a chemically inert side gas around a perimeter of the substrate while the first carrier gas, the second carrier gas, the metal organic precursors in the gaseous state and the oxidizing gas are flowed into the chamber.

13. The method of claim 12, comprising flowing the chemically inert side gas at a flow rate of 50 sccm to 100 sccm.

14. The method of claim 12, wherein the chemically inert side gas is nitrogen.

15. The method of claim 1, wherein the susceptor comprises an inner portion surrounded by an outer portion, a temperature of the inner portion being within 5° C. of a temperature of the outer portion during formation of the ferroelectric layer.

16. The method of claim 1, comprising maintaining a non-oxidizing ambient at a pressure of at least 2 torr after the ferroelectric layer is formed, until a temperature of the substrate is reduced by at least 15° C.

17. The method of claim 1, comprising:
keeping the substrate on the susceptor after the ferroelectric layer is formed, until a temperature of the substrate is reduced by at least 15° C.;
reducing the pressure in the chamber to below 150 millitorr while the substrate is on the susceptor; and
raising the substrate from the susceptor while maintaining the pressure below 150 millitorr.

18. The method of claim 1, wherein the step of removing the substrate from the MOCVD tool comprises maintaining the pressure in the chamber below 150 millitorr while removing the substrate from the chamber.

19. A method of forming a microelectronic device, comprising the steps:
heating a susceptor in a chamber of an MOCVD tool at a temperature 10° C. to 25° C. cooler than a temperature of the susceptor during subsequent formation of a ferroelectric layer;
providing a pressure of less than 150 millitorr in the chamber;
disposing a semiconductor wafer with a diameter of at least 300 millimeters on wafer lift pins, the lift pins being in a raised position so that the semiconductor wafer is disposed more than 2 mm above the susceptor, while the pressure is maintained at less than 150 millitorr;
lowering the lift pins so as to dispose the semiconductor wafer on the susceptor while the pressure is maintained at less than 150 millitorr and while the susceptor is at the temperature 10° C. to 25° C. below than the temperature of the susceptor during subsequent formation of the ferroelectric layer;
raising the temperature of the susceptor from 10° C. to 25° C. below the layer formation temperature to within 5° C. of the temperature of the susceptor during subsequent formation of the ferroelectric layer, over a time period of 30 seconds to 120 seconds;
maintaining the temperature of the susceptor within 5° C. of the temperature of the susceptor during subsequent formation of the ferroelectric layer, over a time period of 45 seconds to 120 seconds; and
subsequently raising the temperature of the susceptor to the temperature of the susceptor during subsequent formation of the ferroelectric layer, over a time period of 10 seconds to 30 seconds;
flowing a first carrier gas into a manifold to combine with a plurality of metal organic precursors in a liquid state, the plurality of metal organic precursors comprising a metal organic precursor including lead, the first carrier gas being chemically inert with respect to the metal organic precursors, a ratio of a flow rate of the first carrier gas to a flow rate of the metal organic precursors in the liquid state being 250 standard cubic centimeters/minute/milliliter/minute (sccm/milliliter/minute) to 500 sccm/milliliter/minute;
flowing the first carrier gas combined with the metal organic precursors into a vaporizer, and flowing a second carrier gas into the vaporizer, to convert the metal organic precursors to a gaseous state, the second carrier gas being chemically inert with respect to the metal organic precursors, a ratio of a flow rate of the second carrier gas to a flow rate of the metal organic precursors in the liquid state being 700 sccm/milliliter/minute to 1500 sccm/milliliter/minute;
flowing the first carrier gas, the second carrier gas and the metal organic precursors into the chamber over the semiconductor wafer, while the susceptor is heated to the temperature of the susceptor during subsequent formation of a ferroelectric layer;
flowing a chemically inert side gas around a perimeter of the semiconductor wafer while the first carrier gas, the second carrier gas, the metal organic precursors and the oxidizing gas are flowing into the chamber;
flowing an oxidizing gas into the chamber over the semiconductor wafer, a ratio of a flow rate of the oxidizing gas into the chamber to a combined flow rate of the metal organic precursors in a liquid state being greater than 3000 sccm/milliliter/minute, while the first carrier gas, the second carrier gas and the metal organic precursors are flowing into the chamber over the semiconductor wafer, to form the ferroelectric layer on the semiconductor wafer;
keeping the semiconductor wafer on the susceptor after the ferroelectric layer is formed, until a temperature of the semiconductor wafer is reduced by at least 15° C.;
reducing the pressure in the chamber to below 150 millitorr while the semiconductor wafer is on the susceptor;
raising the semiconductor wafer from the susceptor while maintaining the pressure below 150 millitorr; and
maintaining the pressure in the chamber below 150 millitorr while removing the semiconductor wafer from the chamber.

* * * * *